United States Patent
Kunitsugu et al.

(10) Patent No.: US 7,039,085 B2
(45) Date of Patent: May 2, 2006

(54) SEMICONDUCTOR LASER DEVICE

(75) Inventors: Yasuhiro Kunitsugu, Tokyo (JP); Hiromasu Matsuoka, Itami (JP); Yasuyuki Nakagawa, Tokyo (JP); Harumi Nishiguchi, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 52 days.

(21) Appl. No.: 10/828,267

(22) Filed: Apr. 21, 2004

(65) Prior Publication Data

US 2004/0213314 A1 Oct. 28, 2004

(30) Foreign Application Priority Data

Apr. 23, 2003 (JP) ............... 2003-118151

(51) Int. Cl.
*H01S 5/00* (2006.01)

(52) U.S. Cl. ..................... 372/49.01; 372/99

(58) Field of Classification Search ............ 372/43.01, 372/98, 99, 49.01
See application file for complete search history.

(56) References Cited

U.S. PATENT DOCUMENTS

| | | | | |
|---|---|---|---|---|
| 5,363,397 A | * | 11/1994 | Collins et al. ................. | 372/92 |
| 6,320,206 B1 | * | 11/2001 | Coman et al. ................. | 257/94 |
| 6,434,180 B1 | * | 8/2002 | Cunningham ............... | 372/50.1 |
| 6,487,227 B1 | * | 11/2002 | Kuramachi ............... | 372/49.01 |
| 6,721,348 B1 | * | 4/2004 | Moser et al. ................. | 372/96 |
| 6,804,282 B1 | * | 10/2004 | Shigihara et al. ........ | 372/49.01 |
| 2004/0042520 A1 | * | 3/2004 | Shigihara et al. ............ | 372/49 |
| 2004/0190576 A1 | * | 9/2004 | Matsuoka et al. ............ | 372/49 |

FOREIGN PATENT DOCUMENTS

| | | |
|---|---|---|
| EP | 1 164 669 | 12/2001 |
| JP | 10-247756 | 9/1998 |
| JP | 2001-119096 | 4/2001 |
| JP | 2001-267677 | 9/2001 |
| JP | 2002-305348 | 10/2002 |

* cited by examiner

*Primary Examiner*—Tan Ho
*Assistant Examiner*—Leith Al-Nazer
(74) *Attorney, Agent, or Firm*—Leydig, Voit & Mayer, Ltd.

(57) ABSTRACT

A semiconductor laser device includes a dielectric multilayer film with a reflectance of 40% or more, on at least one of optical exit faces of a laser chip. The dielectric multilayer film includes a film of tantalum oxide ($Ta_2O_5$) and another film of a dielectric oxide, such as aluminum oxide ($Al_2O_3$), and silicon oxide ($SiO_2$). The tantalum oxide film has an optical absorption coefficient smaller than that of silicon (Si) and thermal stability in emission superior to that of titanium oxide ($TiO_2$), thereby remarkably improving the catastrophic optical damage degradation level of the laser chip.

5 Claims, 4 Drawing Sheets

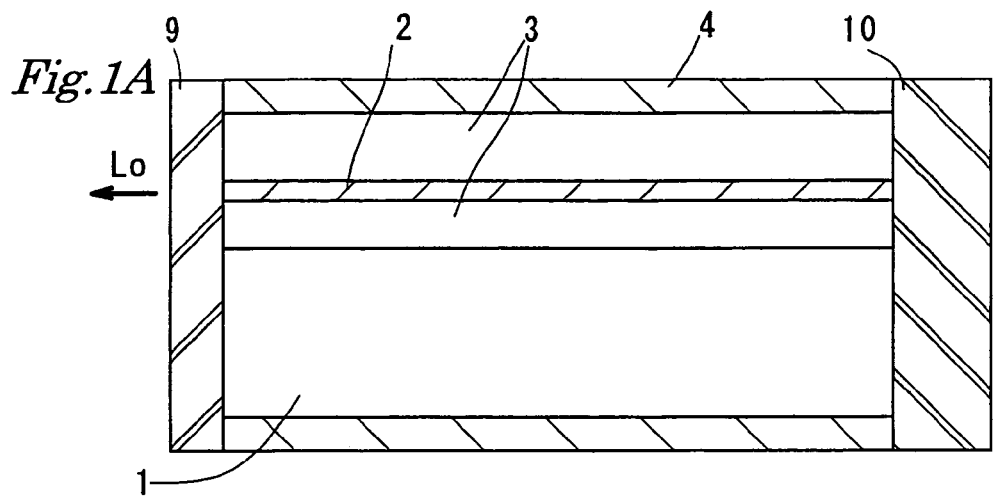
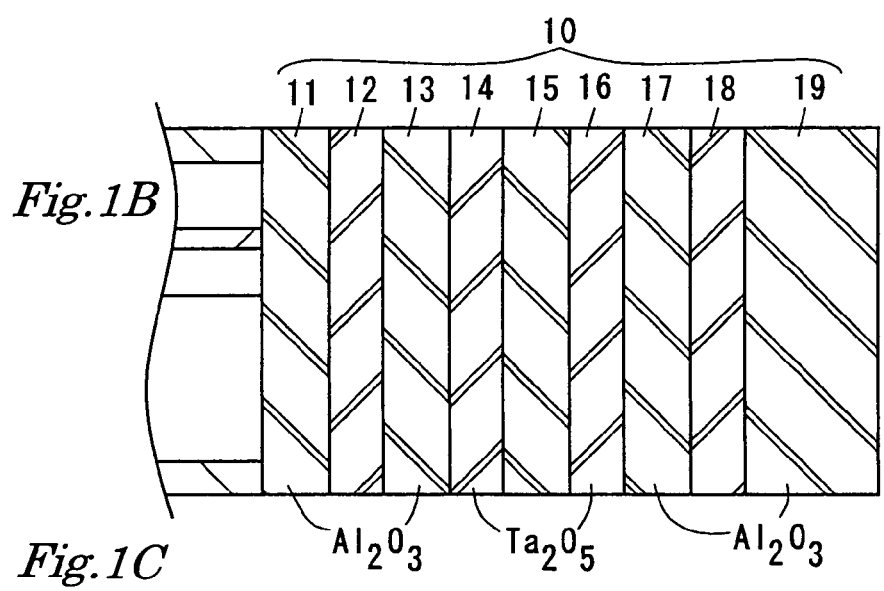
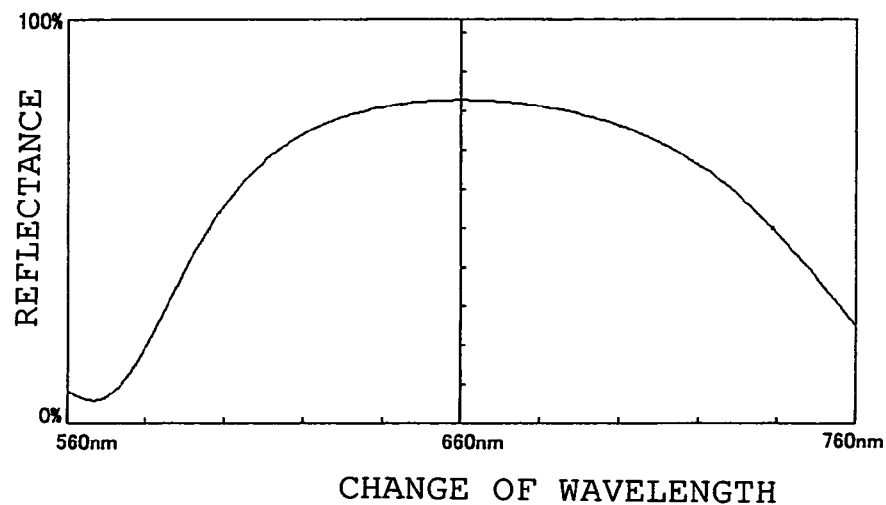

CHANGE OF WAVELENGTH

SEMICONDUCTOR LASER DEVICE

BACKGROUND OF THE INVENTION

1. Field of the Invention

The present invention relates to a semiconductor laser device with a dielectric multilayer film.

2. Description of the Related Art

Generally, a semiconductor laser has resonator end faces formed by wafer cleavage, and dielectric films are formed on the resonator end faces. A desired reflectance of each end face can be controlled by arbitrarily selecting species, film thickness and number of layers of the dielectric film on the end face.

Such a reflective film requires not only characteristics of arbitrarily controllable reflectance but also of high tolerance to degrading due to catastrophic optical damage (COD). The COD degradation means that the film on the end face of a laser device is heated up by absorbing laser light and then melted down as temperature rises, resulting in destruction of the end face.

When forming a reflective film with 40% or more of reflectance, for example, a dielectric multilayer film with a low refractive index film and a high refractive index film laminated alternately is employed in general. The related prior arts are listed as follows:

[Document 1] Japanese Patent Unexamined Publications (koukai): JP-H10-247756 (1998), A

[Document 2] Japanese Patent Unexamined Publications (koukai): JP-2001-267677, A

[Document 3] Japanese Patent Unexamined Publications (koukai): JP-2002-305348, A For example, the document 2 (JP-2001-267677) employs a multilayer reflective film of five layers including a $Al_2O_3$ film and a Si film containing oxygen for the high reflective film on the rear end face of a semiconductor laser, in which introduction of oxygen into a deposition process of Si film enables an extinction coefficient of Si to decrease, thereby preventing the COD degradation. However, with laser oscillation wavelength shortened and laser power heightened, the Si film is likely to have an optical absorption coefficient, which may exceed a certain limit to cause the COD degradation.

Meanwhile, the document 1 (JP-H10-247756) employs a multilayer film of titanium oxide ($TiO_2$) and silicon oxide ($SiO_2$) for the reflective film on the optical exit face of a semiconductor laser to improve the COD level. However, titanium oxide has low thermal stability in emission and is likely to age. Therefore, the reflectance may change because of variations of thickness and refractive index of the film, finally the COD degradation will occur.

Moreover, the document 3 (JP-2002-305348) employs a multilayer film of niobium oxide ($Nb_2O_3$) and silicon oxide ($SiO_2$) for the reflective film on the end face of the resonator of a semiconductor laser with an oscillation wavelength of 400 nm.

In conventional semiconductor lasers, a multilayer reflective film including a high refractive index film, such as Si film, titanium oxide ($TiO_2$) film, is studied. However, with laser power further heightened in the future, temperature of the laser end face will increasingly rise in emission. Therefore, the COD degradation and the aging, such as change of reflectance due to variations of thickness and refractive index, are concerned.

SUMMARY OF THE INVENTION

The purpose of the present invention is to provide a semiconductor laser device with a dielectric multilayer film, which is configured of a material which has an optical absorption coefficient smaller than that of silicon (Si) film and thermal stability in emission superior to that of titanium oxide ($TiO_2$) film to remarkably improve the COD degradation level.

A semiconductor laser device according to the present invention includes:

a dielectric multilayer film with a reflectance of 40% or more, formed on at least one of optical exit faces of a laser chip;

wherein the dielectric multilayer film includes a dielectric film of tantalum oxide.

In the present invention, the dielectric multilayer film may include a dielectric film of aluminum oxide and the dielectric film of tantalum oxide.

Furthermore, the dielectric multilayer film may include a dielectric film of aluminum oxide for a film in contact with the laser chip, and may further include a dielectric film of silicon oxide and the dielectric film of tantalum oxide.

According to the present invention, when the dielectric multilayer film is configured using the tantalum oxide ($Ta_2O_5$) film, the changes of both refractive index and film thickness are kept small even if temperature of the dielectric multilayer film rises by light absorption, thereby remarkably improving deterioration level of the dielectric multilayer film due to aging and COD.

BRIEF DESCRIPTION OF THE DRAWINGS

FIG. 1A is a structural drawing showing a first embodiment of the present invention. FIG. 1B is an enlarged view showing the configuration of a high reflective film. FIG. 1C is a graph showing wavelength dependency of reflectance of the high reflective film.

DETAILED DESCRIPTION OF THE PREFERRED EMBODIMENTS

Figure 2A:
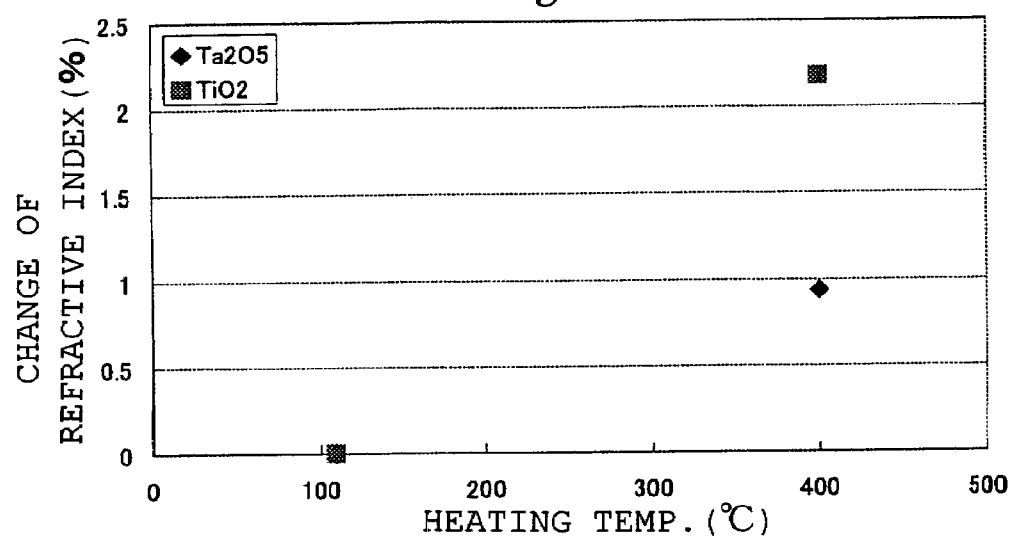
FIG. 2A and FIG. 2B are graphs showing temperature dependencies of both refractive index and film thickness of tantalum oxide ($Ta_2O_5$) and titanium oxide ($TiO_2$) films.

This application is based on an application No. 2003-118151 filed Apr. 23, 2003 in Japan, the disclosure of which is incorporated herein by reference.

Hereinafter, preferred embodiments will be described with reference to drawings.

Embodiment 1

FIG. 1A is a structural drawing showing a first embodiment of the present invention, which illustrates a perpendicular cross section along an optical axis. A laser chip includes a semiconductor substrate 1 of, e.g. GaAs, an active layer 2, cladding layers 3 formed on both upper side and lower side of the active layer 2, and electrodes 4 formed on both upper side and lower side of the cladding layers 3.

A laser semiconductor device includes the above laser chip, a low reflective film 9 formed on the front end face of the laser, and a high reflective film 10 formed on the rear end face of the laser.

Typically, the low reflective film 9 is so configured as to have a reflectance of 15% or less and the high reflective film 10 is so configured as to have a reflectance of 40% or more.

The low and high reflective films 9 and 10 can be formed using deposition process, such as vapor deposition, spatter, and CVD (chemical vapor deposition). A optical resonator is constituted between the front and rear end faces of the laser. Most of laser light which oscillates in the active layer 2 is emitted from the low reflective film 9 as output light Lo and part of laser light is also emitted from the high reflective film 10.

FIG. 1B is an enlarged view showing the configuration of the high reflective film 10. The high reflective film 10 is configured of, in sequence from the side contact with the laser chip, a dielectric film 11 having a refractive index n11 and a thickness d11, a dielectric film 12 having a refractive index n12 and a thickness d12, a dielectric film 13 having a refractive index n13 and a thickness d13, a dielectric film 14 having a refractive index n14 and a thickness d14, a dielectric film 15 having a refractive index n15 and a thickness d15, a dielectric film 16 having a refractive index n16 and a thickness d16, a dielectric film 17 having a refractive index n17 and a thickness d17, a dielectric film 18 having a refractive index n18 and a thickness d18, and a dielectric film 19 having a refractive index n19 and a thickness d19.

A typical dielectric multilayer film is configured so that a dielectric film having a high refractive index and a dielectric film having a low refractive index are alternately and repeatedly laminated. Thickness of each dielectric film is typically designed to be an integral multiplication of quarter of the oscillation wavelength $\lambda$, i.e., $\lambda/4$ in terms of optical length. Therefore, a appropriate film thickness is adjusted according to the refractive index of the dielectric film.

In this embodiment, the high reflective film 10 includes the dielectric film of tantalum oxide ($Ta_2O_5$) and the dielectric film of aluminum oxide ($Al_2O_3$). Tantalum oxide has characteristics of small changes of both refractive index and film thickness even if temperature is rising by heating, as described later, which is suitable for the dielectric multilayer film.

Next, a specific configuration of the high reflective film 10 will be described hereinafter. Here, the high reflective film 10 formed on a red semiconductor laser with oscillation wavelength $\lambda=660$ nm will be exemplified. The equivalent refractive index of the laser chip is 3.817.

As shown FIG. 1B, the dielectric film 11, i.e., the first layer in contact with the laser chip is formed of aluminum oxide ($Al_2O_3$) with refractive index n11=1.641, thickness d11 of which is designed to be 100.5 nm equivalent to $\lambda/4$ in terms of optical length.

The dielectric film 12, i.e., the second layer is formed of tantalum oxide ($Ta_2O_5$) with refractive index n12=2.031, thickness d12 of which is designed to be 81.2 nm equivalent to $\lambda/4$ in terms of optical length.

The dielectric film 13, i.e., the third layer is formed of aluminum oxide ($Al_2O_3$) with refractive index n13=1.641, thickness d13 of which is designed to be 100.5 nm equivalent to $\lambda/4$ in terms of optical length.

The dielectric film 14, i.e., the fourth layer is formed of tantalum oxide ($Ta_2O_5$) with refractive index n14=2.031, thickness d14 of which is designed to be 81.2 nm equivalent to $\lambda/4$ in terms of optical length.

The dielectric film 15, i.e., the fifth layer is formed of aluminum oxide ($Al_2O_3$) with refractive index n15=1.641, thickness d15 of which is designed to be 100.5 nm equivalent to $\lambda/4$ in terms of optical length.

The dielectric film 16, i.e., the sixth layer is formed of tantalum oxide ($Ta_2O_5$) with refractive index n16=2.031, thickness d16 of which is designed to be 81.2 nm equivalent to $\lambda/4$ in terms of optical length.

The dielectric film 17, i.e., the seventh layer is formed of aluminum oxide ($Al_2O_3$) with refractive index n17=1.641, thickness d17 of which is designed to be 100.5 nm equivalent to $\lambda/4$ in terms of optical length.

The dielectric film 18, i.e., the eighth layer is formed of tantalum oxide ($Ta_2O_5$) with refractive index n18=2.031, thickness d18 of which is designed to be 81.2 nm equivalent to $\lambda/4$ in terms of optical length.

The dielectric film 19, i.e., the ninth layer is formed of aluminum oxide ($Al_2O_3$) with refractive index n19=1.641, thickness d19 of which is designed to be 201.0 nm equivalent to $\lambda/2$ in terms of optical length.

FIG. 1C is a graph showing wavelength dependency of reflectance of the high reflective film 10 having the above configuration. This graph shows a reflectance of about 83% at the center wavelength $\lambda=660$ nm, where the change of reflectance is small as against the change of oscillation wavelength. Therefore, it can be seen that the high reflective film 10 with the above configuration has a stable reflectance even if the oscillation wavelength of the laser varies.

Figure 2B:
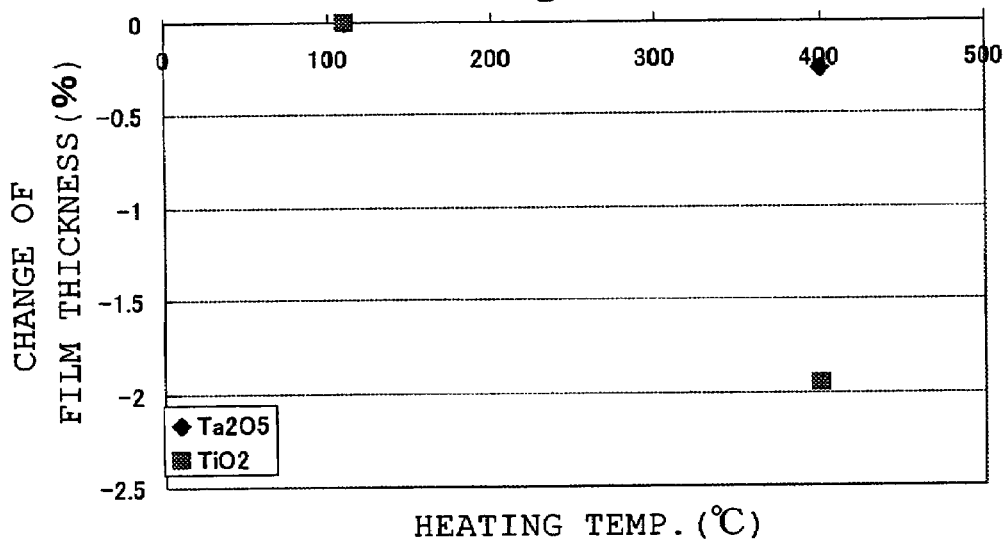

FIG. 2A and FIG. 2B are graphs showing temperature dependencies of both refractive index and film thickness of tantalum oxide ($Ta_2O_5$) and titanium oxide ($TiO_2$) films, where the changes of both refractive index and film thickness at a heating temperature of about 400 degree-C. are illustrated in percentage terms using reference values of 100% for the refractive index and the film thickness at a heating temperature of about 110 degree-C.

The graphs show that refractive index of the titanium oxide film increases by +2.18% about 400 degree-C., while refractive index of the tantalum oxide film is suppressed by an increment of +0.94%, in addition, film thickness of the titanium oxide film decreases by −1.95% about 400 degree-C., while film thickness of the tantalum oxide film is suppressed by a decrement of −0.26%. It can be seen from the graphs that the tantalum oxide film is superior in thermal stability to the titanium oxide film.

Accordingly, when the laser chip emits laser light of high power and temperature of the high reflective film 10 rises by light absorption, the existence of titanium oxide ($TiO_2$) film will encourage the changes of both refractive index and film thickness. Therefore, as laser light is repeatedly turned on and off, the high reflective film 10 is likely to be debased by aging, resulting in the COD degradation.

On the other hand, when the high reflective film 10 is formed using the tantalum oxide ($Ta_2O_5$) film, the changes of both refractive index and film thickness are kept small even if temperature of the high reflective film 10 rises by light absorption, thereby preventing the high reflective film 10 from deteriorating by aging and COD.

Incidentally, the above description exemplifies the high reflective film 10 which includes the multilayered films having four cycles using the repetitious unit of both the single tantalum oxide film for the high refractive index film and the single aluminum oxide film for the low refractive index film, and the additive aluminum oxide film for the low refractive index film exposed to the atmosphere. The high reflective film 10 may be configured of one to three cycles or five cycles or more using the repetitious unit of both the single tantalum oxide film and the single aluminum oxide film to control a desired reflectance. Furthermore, when shifting the center wavelength of the reflectance characteristic from 660 nm, measures can be taken by converting the film thickness of each dielectric film to another film thickness in terms of optical length.

Embodiment 2

Figure 3A:
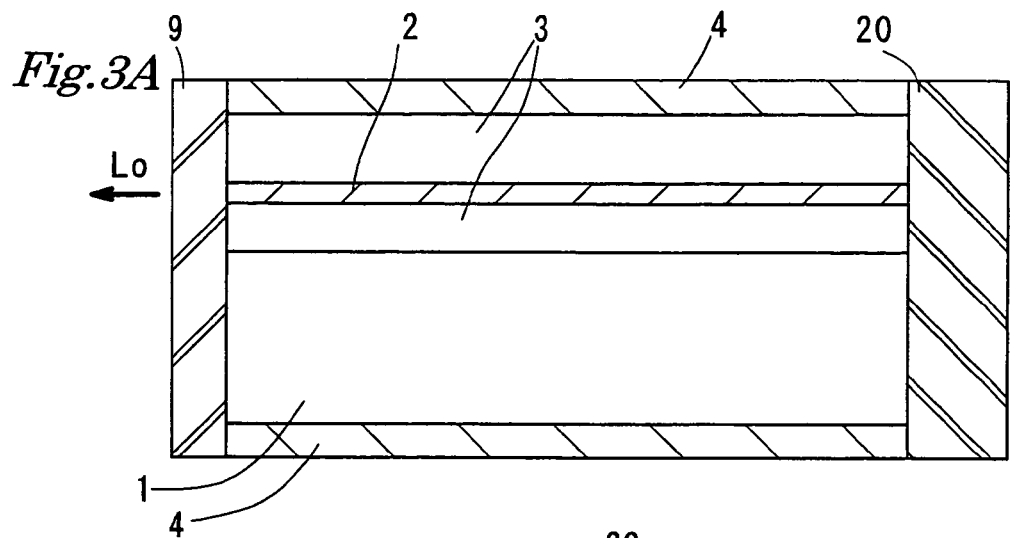
FIG. 3A is a structural drawing showing a second embodiment of the present invention.

FIG. 3A is a structural drawing showing a second embodiment of the present invention, which illustrates a perpendicular cross section along an optical axis. A laser chip includes a semiconductor substrate 1 of, e.g. GaAs, an active layer 2, cladding layers 3 formed on both upper side and lower side of the active layer 2, and electrodes 4 formed on both upper side and lower side of the cladding layers 3.

A laser semiconductor device includes the above laser chip, a low reflective film 9 formed on the front end face of the laser, and a high reflective film 20 formed on the rear end face of the laser.

Typically, the low reflective film 9 is so configured as to have a reflectance of 15% or less and the high reflective film 20 is so configured as to have a reflectance of 40% or more.

The low and high reflective films 9 and 20 can be formed using deposition process, such as vapor deposition, spatter, and CVD (chemical vapor deposition). A optical resonator is constituted between the front and rear end faces of the laser. Most of laser light which oscillates in the active layer 2 is emitted from the low reflective film 9 as output light Lo and part of laser light is also emitted from the high reflective film 20.

Figure 3B:
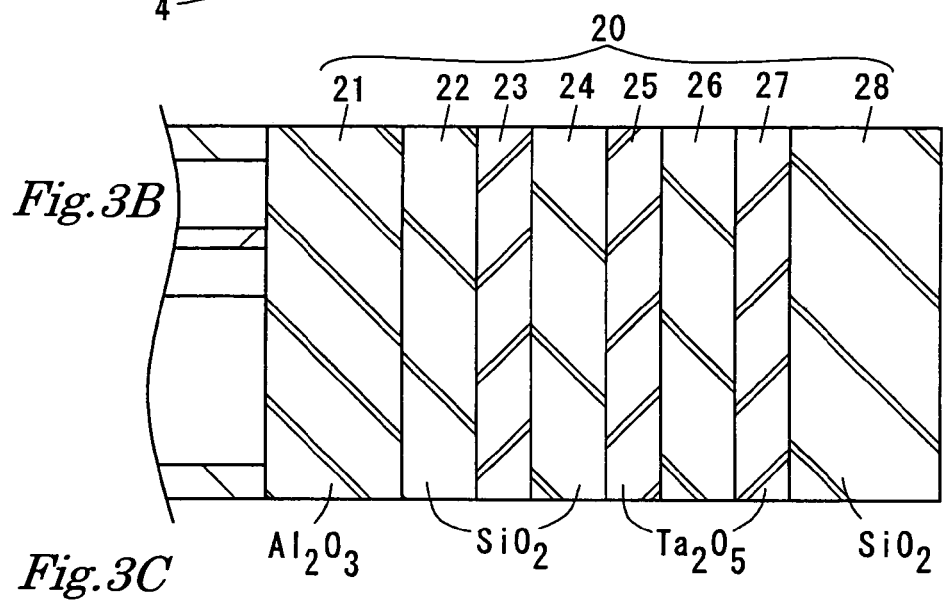
FIG. 3B is an enlarged view showing the configuration of another high reflective film.

FIG. 3B is an enlarged view showing the configuration of the high reflective film 20. The high reflective film 20 is configured of, in sequence from the side contact with the laser chip, a dielectric film 21 having a refractive index n21 and a thickness d21, a dielectric film 22 having a refractive index n22 and a thickness d22, a dielectric film 23 having a refractive index n23 and a thickness d23, a dielectric film 24 having a refractive index n24 and a thickness d24, a dielectric film 25 having a refractive index n25 and a thickness d25, a dielectric film 26 having a refractive index n26 and a thickness d26, a dielectric film 27 having a refractive index n27 and a thickness d27, and a dielectric film 28 having a refractive index n28 and a thickness d28.

A typical dielectric multilayer film is configured so that a dielectric film having a high refractive index and a dielectric film having a low refractive index are alternately and repeatedly laminated. Thickness of each dielectric film is typically designed to be an integral multiplication of quarter of the oscillation wavelength $\lambda$, i.e., $\lambda/4$ in terms of optical length. Therefore, a appropriate film thickness is adjusted according to the refractive index of the dielectric film.

In this embodiment, the high reflective film 20 includes the dielectric film of aluminum oxide ($Al_2O_3$), the dielectric film of silicon oxide ($SiO_2$) and the dielectric film of tantalum oxide ($Ta_2O_5$). Tantalum oxide has characteristics of small changes of both refractive index and film thickness even if temperature is rising by heating, as shown in FIG. 2, which is suitable for the dielectric multilayer film.

Next, a specific configuration of the high reflective film 20 will be described hereinafter. Here, the high reflective film 20 formed on a red semiconductor laser with oscillation wavelength $\lambda$=660 nm will be exemplified. The equivalent refractive index of the laser chip is 3.817.

As shown FIG. 3B, the dielectric film 21, i.e., the first layer in contact with the laser chip is formed of aluminum oxide ($Al_2O_3$) with refractive index n21=1.641, thickness d21 of which is designed to be 201.0 nm equivalent to $\lambda/2$ in terms of optical length.

The dielectric film 22, i.e., the second layer is formed of silicon oxide ($SiO_2$) with refractive index n22=1.461, thickness d22 of which is designed to be 112.9 nm equivalent to $\lambda/4$ in terms of optical length.

The dielectric film 23, i.e., the third layer is formed of tantalum oxide ($Ta_2O_5$) with refractive index n23=2.031, thickness d23 of which is designed to be 81.2 nm equivalent to $\lambda/4$ in terms of optical length.

The dielectric film 24, i.e., the fourth layer is formed of silicon oxide ($SiO_2$) with refractive index n24=1.461, thickness d22 of which is designed to be 112.9 nm equivalent to $\lambda/4$ in terms of optical length.

The dielectric film 25, i.e., the fifth layer is formed of tantalum oxide ($Ta_2O_5$) with refractive index n25=2.031, thickness d25 of which is designed to be 81.2 nm equivalent to $\lambda/4$ in terms of optical length.

The dielectric film 26, i.e., the sixth layer is formed of silicon oxide ($SiO_2$) with refractive index n26=1.461, thickness d26 of which is designed to be 112.9 nm equivalent to $\lambda/4$ in terms of optical length.

The dielectric film 27, i.e., the seventh layer is formed of tantalum oxide ($Ta_2O_5$) with refractive index n27=2.031, thickness d27 of which is designed to be 81.2 nm equivalent to $\lambda/4$ in terms of optical length.

The dielectric film 28, i.e., the eighth layer is formed of silicon oxide ($SiO_2$) with refractive index n28=1.461, thickness d28 of which is designed to be 225.8 nm equivalent to $\lambda/2$ in terms of optical length.

Figure 3C:
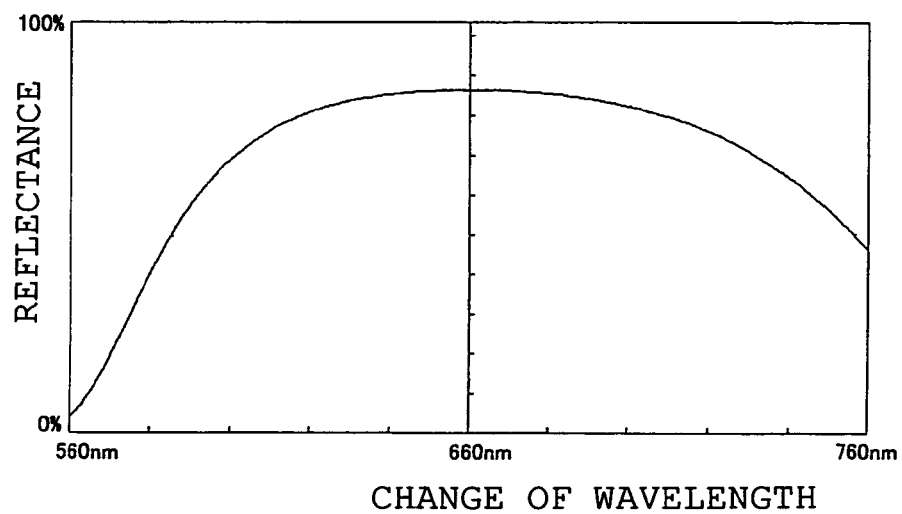
FIG. 3C is a graph showing wavelength dependency of reflectance of the high reflective film.

FIG. 3C is a graph showing wavelength dependency of reflectance of the high reflective film 20 having the above configuration. This graph shows a reflectance of about 86% at the center wavelength $\lambda$=660 nm, where the change of reflectance is small as against the change of oscillation wavelength. Therefore, it can be seen that the high reflective film 20 with the above configuration has a stable reflectance even if the oscillation wavelength of the laser varies.

Incidentally, the above description exemplifies the high reflective film 20 which includes the multilayered films having three cycles using the repetitious unit of both the single tantalum oxide film for the high refractive index film and the single silicon oxide film for the low refractive index film, and the additive aluminum oxide film for the low refractive index film in contact with the chip and the additive silicon oxide film for the low refractive index film exposed to the atmosphere. The high reflective film 20 may be configured of one to two cycles or four cycles or more using the repetitious unit of both the single tantalum oxide film and the single silicon oxide film to control a desired reflectance. Furthermore, when shifting the center wavelength of the reflectance characteristic from 660 nm, measures can be taken by converting the film thickness of each dielectric film to another film thickness in terms of optical length.

Figure 4:
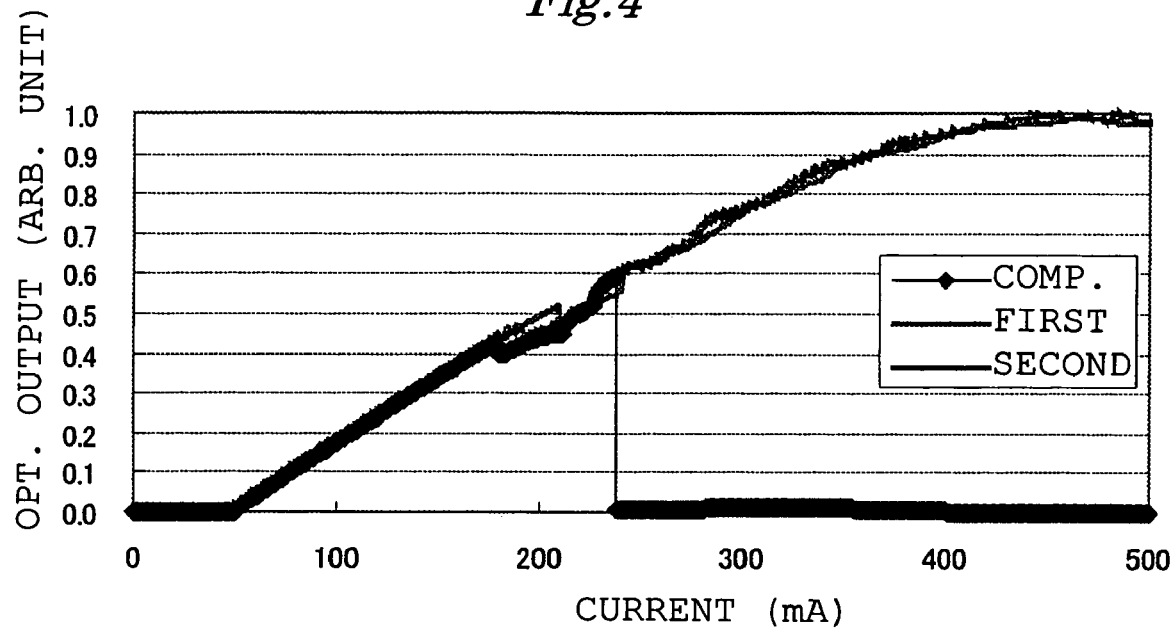
FIG. 4 is a graph showing an example of optical output characteristics versus driving current of a semiconductor laser.

FIG. 4 is a graph showing an example of optical output characteristics versus driving current of the semiconductor laser. For a conventional high reflective film, a multilayered dielectric film is configured of the total five layers, in sequence from the side contact with the laser chip, aluminum oxide ($Al_2O_3$) film, silicon (Si) film, aluminum oxide ($Al_2O_3$) film, silicon (Si) film, and aluminum oxide ($Al_2O_3$) film.

This graph shows that the optical outputs of any lasers increase when the driving currents exceed an oscillation threshold current of about 50 mA. The optical output of the conventional type sharply declines at driving current of about 240 mA, resulting in the COD degradation.

On the other hand, in the high reflective films 10 and 20 according to the first and second embodiments, the COD degradation does not take place until driving current of 500 mA. It can be seen that the high reflective films 10 and 20 can withstand the optical output approximately 1.7 times as high as the conventional high reflective film can.

The above description exemplifies that the dielectric multilayer film according to the present invention is formed on the rear end face of the laser. The dielectric multilayer film according to the present invention may be formed on the front end face of the laser.

Although the present invention has been fully described in connection with the preferred embodiments thereof and the accompanying drawings, it is to be noted that various changes and modifications are apparent to those skilled in the art. Such changes and modifications are to be understood as included within the scope of the present invention as defined by the appended claims unless they depart therefrom.

What is claimed is:

1. A semiconductor laser device comprising:
   a semiconductor body including a semiconductor substrate supporting a plurality of semiconductor layers, the semiconductor layers including an active layer in which light having a characteristic wavelength is generated, a pair of cladding layers disposed on opposite sides of the active layer, and opposed front and rear end faces transverse to the substrate and semiconductor layers, the light generated within the semiconductor laser exiting through the front end face and being reflected from the rear end face;
   a film on the front end face and having a first, relatively low reflectivity at the characteristic wavelength; and
   a dielectric multilayer film on the rear end face and having a second reflectivity, higher than the first reflectivity, and at least 40% at the characteristic wavelength, wherein the dielectric multilayer film includes a film of aluminum oxide in contact with the rear end face, a film of silicon oxides, and a film of tantalum oxide.

2. The semiconductor laser device according to claim 1, wherein the dielectric multilayer film has, in sequence, from the layer in contact with the rear end face, a first film of aluminum oxide, at least three paired layers, and a final film of silicon oxide, and each paired layer includes a silicon oxide film and a tantalum oxide film.

3. The semiconductor laser device according to claim 2, wherein the dielectric multilayer film has N layers, the first layer, from the layer in contact with the rear end face, has a thickness equivalent to $\lambda/2$ in terms of optical length at the characteristic wavelength, and each of the second to (N−1)th layers has a thickness equivalent to $\lambda/4$ in terms of optical length at the characteristic wavelength, and the Nth layer has a thickness equivalent to $\lambda/2$ in terms of optical length at the characteristic wavelength.

4. A semiconductor laser device comprising:
   a semiconductor body including a semiconductor substrate supporting a plurality of semiconductor layers, the semiconductor layers including an active layer in which light having a characteristic wavelength is generated, a pair of cladding layers disposed on opposite sides of the active layer, and opposed front and rear end faces transverse to the substrate and semiconductor layers, the light generated within the semiconductor laser exiting through the front end face and being reflected from the rear end face;
   a film on the front end face and having a first, relatively low reflectivity at the characteristic wavelength; and
   a dielectric multilayer film on the rear end face and having a second reflectivity, higher than the first reflectivity and at least 40% at the characteristic wavelength, wherein the dielectric multilayer film has, in sequences, from the layer in contact with the rear end face, at least three paired layers, and a final film of aluminum oxide, and each of the paired layers includes an aluminum oxide film and a tantalum oxide film.

5. The semiconductor laser device according to claim 4, wherein the dielectric multilayer film has N layers, each of the first to (N−1)th layers, from the layer in contact with the rear end face, has a thickness equivalent to $\lambda/4$ in terms of optical length at the characteristic wavelength, and the Nth layer has a thickness equivalent to $\lambda/2$ in terms of optical length at the characteristic wavelength.

* * * * *